United States Patent [19]

Raza et al.

[11] Patent Number: 5,748,559
[45] Date of Patent: May 5, 1998

[54] CIRCUIT FOR HIGH SPEED SERIAL PROGRAMMING OF PROGRAMMABLE LOGIC DEVICES

[75] Inventors: S. Babar Raza, Sunnyvale; James B. MacArthur, Santa Clara, both of Calif.

[73] Assignee: Cypress Semiconductor Corporation, San Jose, Calif.

[21] Appl. No.: 587,659

[22] Filed: Jan. 17, 1996

[51] Int. Cl.$^6$ .................................................. G11C 8/00
[52] U.S. Cl. .................. 365/233; 365/189.12; 365/236; 365/239; 365/240
[58] Field of Search ............................. 365/233, 239, 365/236, 240, 189.12

[56] References Cited

U.S. PATENT DOCUMENTS

| | | | |
|---|---|---|---|
| 4,773,049 | 9/1988 | Takemae | 365/239 |
| 5,432,747 | 7/1995 | Fuller et al. | 365/233 |
| 5,487,049 | 1/1996 | Hang | 365/239 |

*Primary Examiner*—Son T. Dinh
*Attorney, Agent, or Firm*—Bliss McGlynn, P.C.

[57] ABSTRACT

The present invention provides a circuit for programming a logic device comprising a first register for shifting data to a memory array, a second register for decoding an address space for a particular word within the logic device. The memory array has an address input and a data input coupled to the first and second registers. One of the registers is implemented as a registered counter block while the other register can be implemented as either a shift register, for a low pin count design, and/or a parallel load register for a higher pin counter and higher performance design.

32 Claims, 3 Drawing Sheets

CIRCUIT FOR HIGH SPEED SERIAL PROGRAMMING OF PROGRAMMABLE LOGIC DEVICES

FIELD OF THE INVENTION

The present invention relates generally to high speed programming of programmable logic devices (PLDs) and more particularly to high speed programming of PLDs using address counter logic to access programmable elements within a memory array.

BACKGROUND OF THE INVENTION

A programmable logic device provides an economical and efficient means for implementing predetermined boolean logic functions. Such a device typically consists of a group of programmable AND gates responsive to a plurality of inputs used to generate a number of predetermined product terms. A typical PLD also comprises a group of fixed/programmable OR gates responsive to the product terms for generating a plurality of sum-of-product (SOP) terms and a macrocell responsive to the sum-of-product terms for generating a desired output.

One method of programming a PLD is to serially program elements within an address/word array by serially shifting data and address information into the device address register (AR) to locate the word of elements to be programmed. Additionally data is shifted into a data register (DR) to specify a new word value to be programmed. The address register and the data register are typically chained together to form a (a+d) bit shift register path. Such an implementation is illustrated by the device 10 shown in FIG. 1. The device 10 generally comprises a data register 11 an address register 12 and an array of programming elements 14. The data register 11 receives an input 16 from a serial clock SCLK and an input 18 from a serial data input SDI. The address register 12 receives a first input 20 from the serial clock SCLK and a second input 22 from the data register 11. The address register 12 has an output 24 that provides a serial data output SDO. The address register 12 also has a bus output 26 that provides address information to the array 14. Similarly, the data register 11 has a bus output 28 that provides address information to the array 14. The bus output 26 combined with the bus output 28 provides n-bits of programming information in the array 14.

A disadvantage with the technique illustrated in FIG. 1 is that all of the programming elements (i.e., n=a×d), must be sequenced during programming or verifying of the device 10. Additionally, the serial programming technique illustrated in FIG. 1 requires N clock (shift) cycles to sequence through all of the elements of the array 14 during a program or verify operation. The implementation requires one serial clock input SCLK, one serial data input SDI and one serial data output SDO.

FIG. 2 illustrates a similar prior art technique where the serial data input is modified to become a parallel data input DI. The serial clock SCLK is modified to a clock CLK. The data input DI comprises a p-bit wide bus that provides a signal to input 18 of the data register 11 as well as to an input 19 to the address register 12. While the device 10' illustrated in FIG. 2 provides faster performance than the device 10 described in FIG. 1, the performance is realized at the expense of requiring more data input and data output pins. In a best case situation the FIG. 2 technique takes n/p clock (load) cycles to sequence through all of the elements of the array 14.

It is therefore an object of the present invention to provide a circuit for providing high speed programming of PLDs (or CPLDs) that reduces the number of clock (shift cycles) to sequence through elements in a serial design, reduces the number of clock (load cycles) and the number of pins required to sequence through all the elements in a parallel design, improves the performance of the programming of PLDs, improves the performance of verifying the programming of PLDs, eliminates the need to load the address of a programming element space bit or word and reduces the overall cost of programming and testing of PLDs.

SUMMARY OF THE INVENTION

The present invention provides a circuit for programming a logic device comprising a first register for shifting data to a memory array, a second register for decoding an address space for a particular word within the logic device. The memory array has an address input and a data input coupled to the first and second registers. One of the registers is implemented as a registered counter block while the other register can be implemented as either a shift register, for a low pin count design, and/or a parallel load register for a higher pin counter and higher performance design.

BRIEF DESCRIPTION OF THE DRAWINGS

These and other objects, features and advantages of the present invention will be apparent from the following detailed description and the appended claims in which:

DETAILED DESCRIPTION OF THE PREFERRED EMBODIMENT

Figure 1:
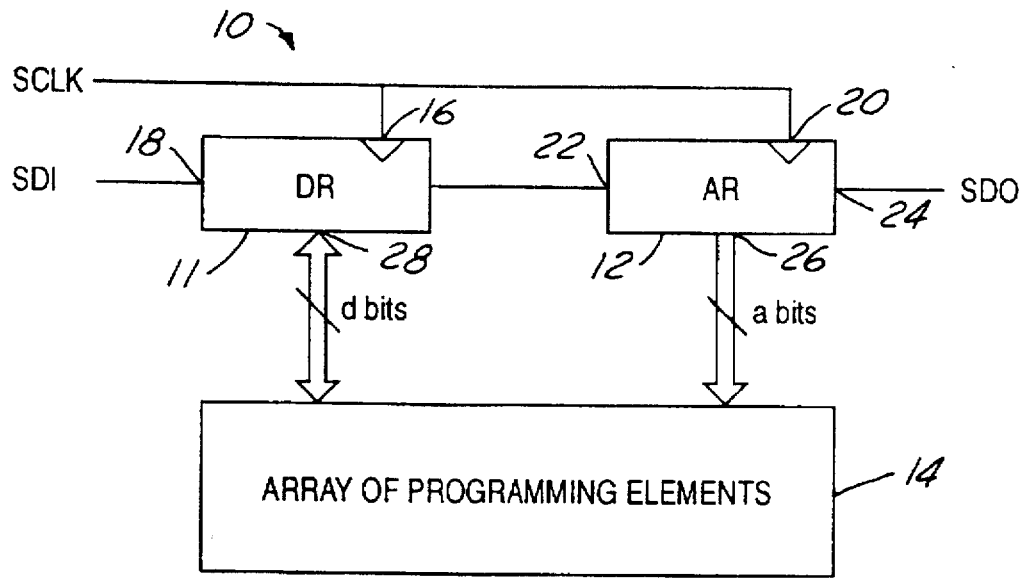
FIG. 1 is a block diagram of a prior art scheme.
Figure 2:
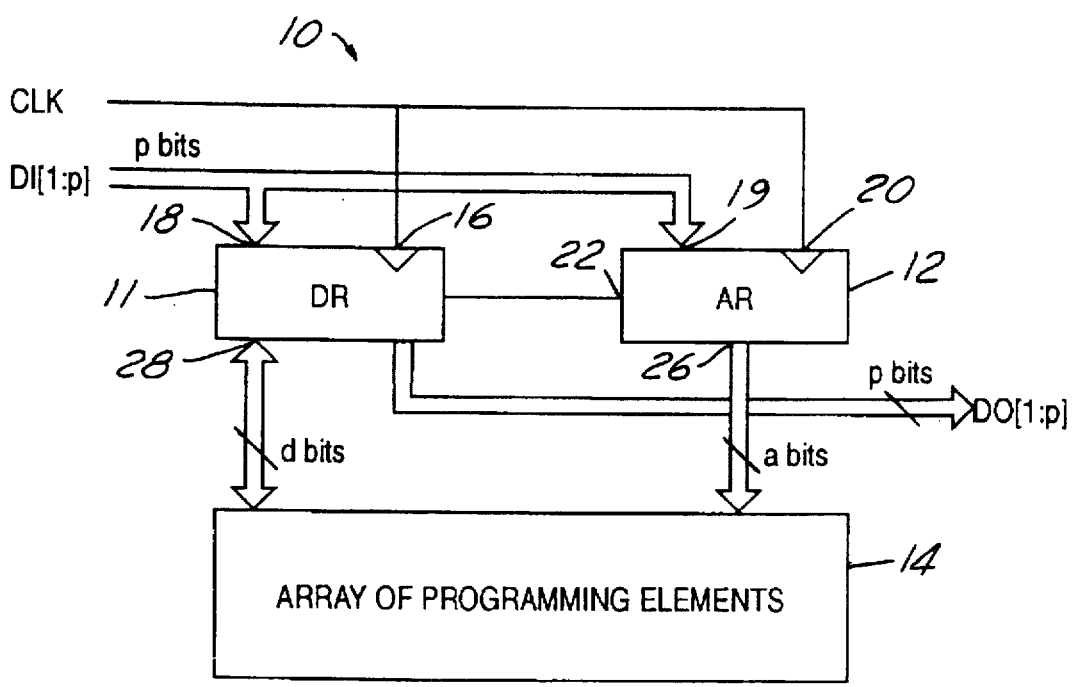
FIG. 2 is a block diagram of an alternate prior art scheme.
Figure 3:
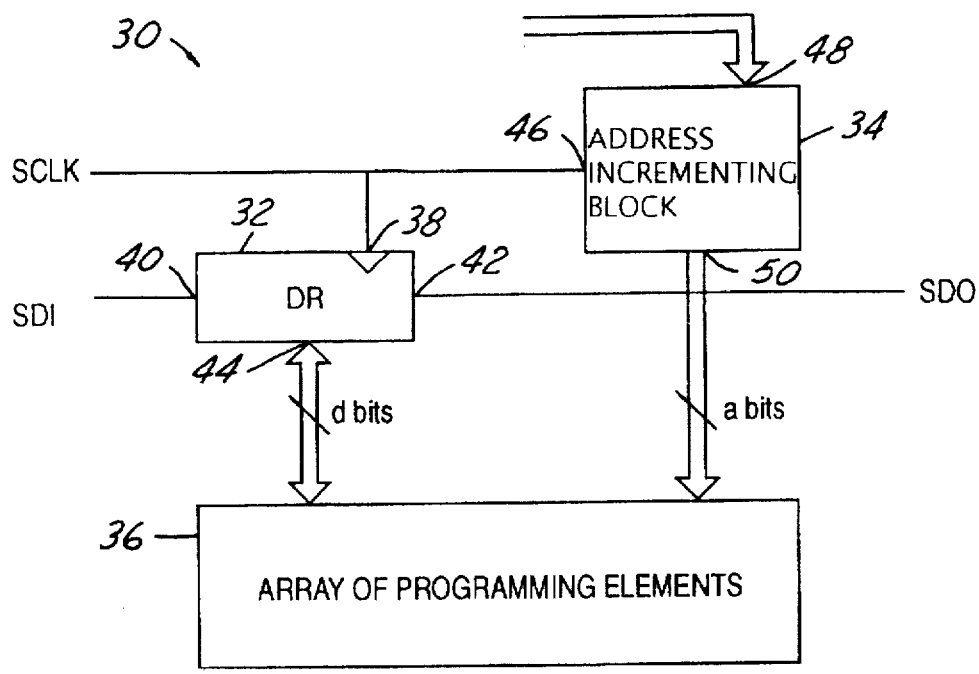
FIG. 3 is a block diagram of the overall circuitry of the present invention.

Referring to FIG. 3, a device 30 illustrating the preferred embodiment of the present invention is shown. The device 30 generally comprises a data register 32, an address incremeting block 34 and an array 36. The data register 32 has an input 38 that receives a serial clock SCLK and a second input 40 that receives a serial data input SDI. The data register 32 has a output 42 that provides a serial data output SDO and an output bus 44 that presents address information to the array 36. The address incrementing block 34 has an input 46 that receives a signal from the serial clock SCLK, a bus input 48 that receives control information and a bus output 50 that provides additional address information to the array 36. The address incrementing block 34 presents a unique address location to the array 36 indicating a particular memory address to read/write a digital word from the data register 32. The bus input 48 receives information that resets the address incrementing block 34 upon power up of the device 30. The bus input 48 may also provide other counter functions such as dividing the counter by 2, 4, 8 etc. The data register can be implemented using a shift register, a parallel load register or any other appropriate register suitable for the design criteria of a particular application.

Figure 4:
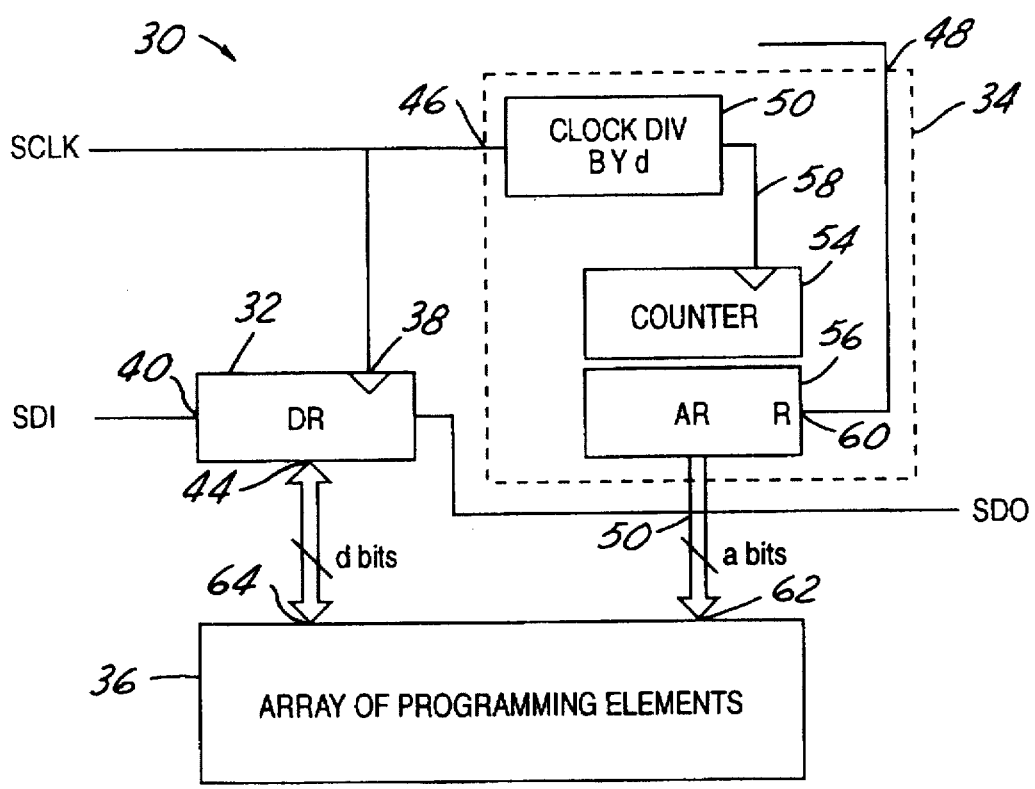
FIG. 4 is a block diagram of a first alternative embodiment of the present invention.

Referring to FIG. 4, a block diagram of a first alternative embodiment of the present invention is shown. Particularly, the address incrementing block 34 is shown in more detail. The address incrementing block 34 comprises a clock divider 52, a counter 54 and an address register 56. The clock divider 52 receives the serial clock SCLK and divides it by a predetermined value d which is equal to the width of the bus output 44. The clock divider 52 presents an output 58 to the counter 54. The counter 54 is coupled to the address register 56 which also receives an input 60 from the input 48. The serial clock SCLK is divided by the number of bits in the data register 32. When the serial data input SDI fills the data register 32 with the next digital word, the address register 56 is incremented to the next address value. Therefore, an independent address register value is not required to be serially shifted into the address register 56 as shown in the prior art. The input 60 provides a reset that is initiated upon power up of the device 30. The array 36 receives unique address location from the address incrementing block register 32 at a data input 64. The data received at the data input 64 is programmed into the array 36 at the unique address location received at the address input 62.

Figure 5:
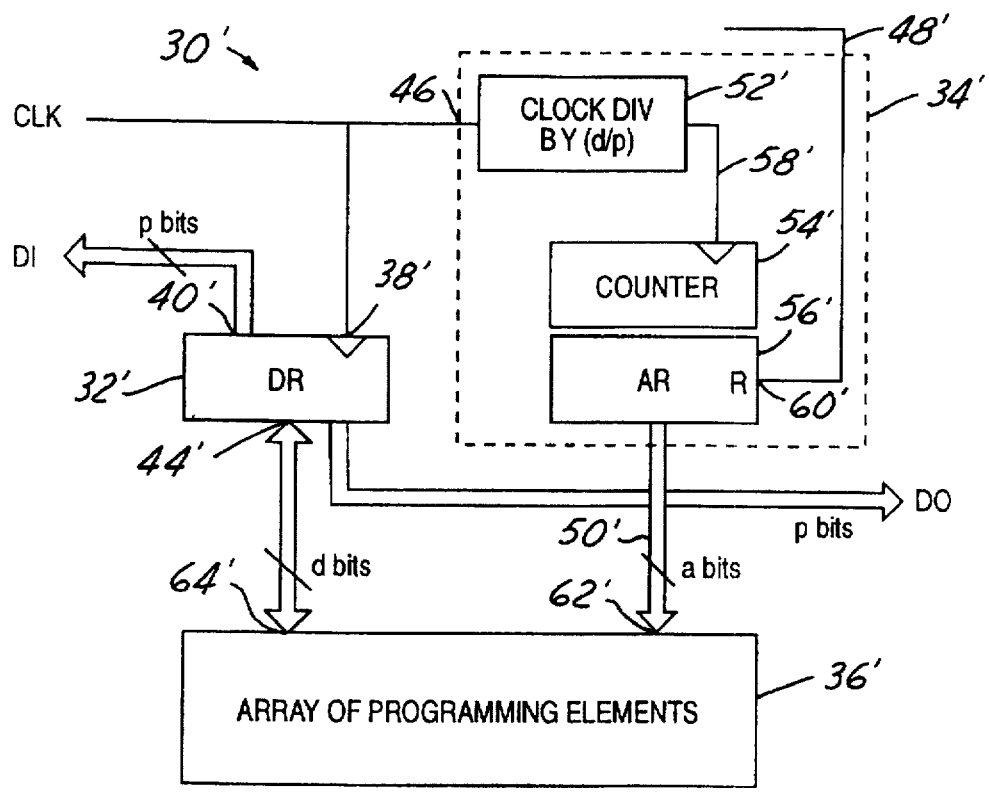
FIG. 5 is a block diagram of a second alternative embodiment of the present invention.

Referring to FIG. 5, a block diagram of a second alternative embodiment of the present invention is shown. Components similar to those shown in FIG. 4 are indicated as a primed reference number. The data register 32' has an input 40' that is a p-bit wide bus. This allows for parallel loading of data words into the data register 32'. Similarly the serial data output SDO is modified to a data output DO, which indicates the parallel nature of the data output DO. The data output DO is a p-bit wide bus. The clock divider 52' divides the clock CLK by (d/p), where d is the width of the bus output 44 presented to the array 36' and p is the width of the data output DO. The bus output 50 presents a unique address location to the address input 62' of the array 36'. The unique address location received at the address input 62' must change to a new value for each digital word received at the data input 64' of the array 36'. To compensate for the width of the word loaded at the data input 64', the address incrementing block 34' is only incremented when the data register 32' is completely filled with the new word. If p is not equal to d, more than one clock cycle would be required to load the data register 32'. This would also require the implementation of a multiplexer at the data input DI or a clock enable at the data register 32. In one implementation, the value of the counter 54' progresses sequentially in response to the input 58' from the clock divider 52'. Other implementations can be used to implement the counter 54' to fit the design criteria of a particular application. It should be appreciated that the counter 54' should provide a unique address location each time the data register 32 is filled or at a periodic interval based on the clock divider 52'.

Figure 6:
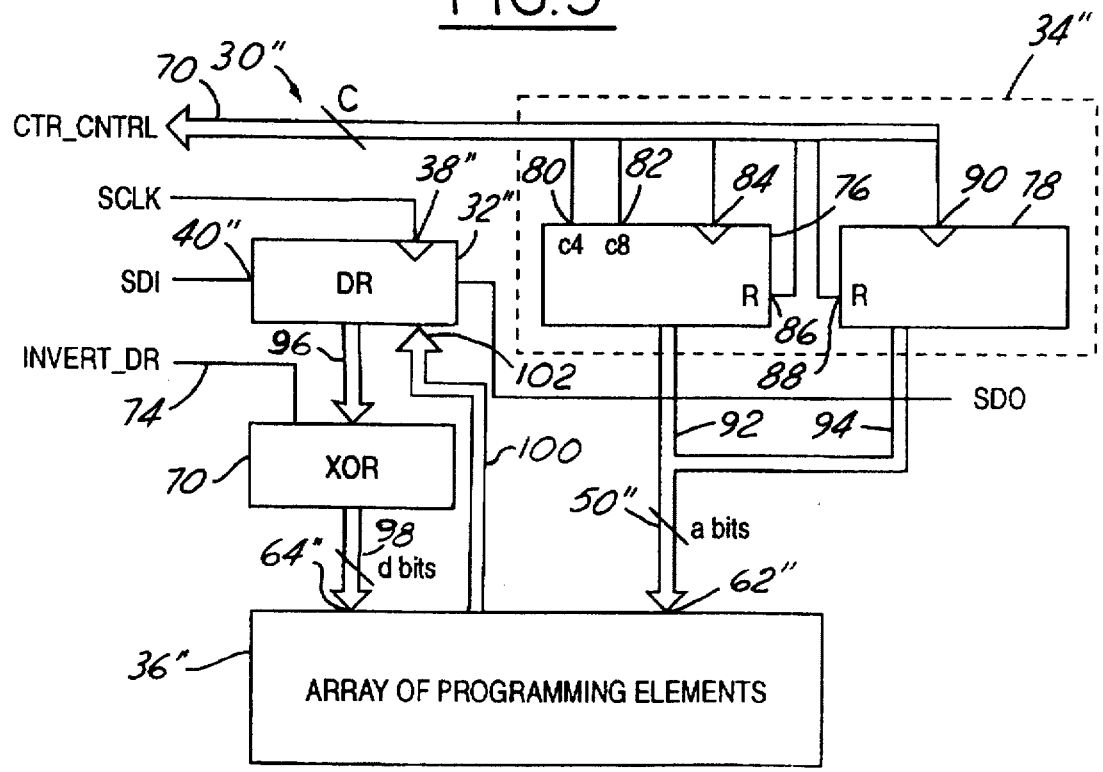
FIG. 6 is a block diagram of a third alternative embodiment of the present invention.

Referring to FIG. 6, a second alternative embodiment of the present invention is shown. The device 30" has additional components comprising an exclusive OR gate 70, a counter control signal 72 and an inverted driver signal 74. The address incrementing block 34" comprises a first address incrementing block 76 and a second address incrementing block 78. The counter control signal 72 is a c-bit wide bus that is presented to the address incrementing block 34". A first bit is presented to an input 80, a second bit is presented to an input 82, a third bit is presented to an input 84 and a fourth input is presented to an input 86 of the address incrementing block 78. The address incrementing block 78 receives a fifth bit at an input 88 and a sixth bit at an input 90. The address incrementing block 76 has a first bus output 92 and the address incrementing block 78 has a second bus output 94. The first and second bus outputs 92 and 94 are both presented to the address input 62" of the array 36'. The data register 32" has a unidirectional bus 96 that presents data to the XOR gate 70. The XOR gate 70 has a unidirectional bus 98 that presents data to the data input 64" of the array 36". The array 36" has a unidirectional bus 100 that presents data to an input 102 of the data register 40".

By implementing separate address incrementing blocks 76 and 78, a fractured address incrementing block block 34" is realized. Since the fractured address incrementing block 34" is split into two independent registers, the counter functions can be tailored to the address space of a particular programmable product. Specifically, for example, the address incrementing block 76 could be used to implement a row address location while the address incrementing block 78 could be used to indicate a column address location in a typical row x column memory organization. It should be appreciated that while two separate address incrementing blocks 76 and 78 are shown for illustrative purposes only. Additional address incrementing blocks 76 and 78 could be implemented to realize other memory organization structures such as a three dimensional memory organization or any other memory organizations specific to a particular programmable product. Additionally, the most significant bit (MSB) of the address space can count by one, four or eight which may be useful for programming a sparse design into a programmable device or may facilitate testing of the array 36" under certain patterns.

The inverted driver input 74 is an additional control signal that is added to the data register 40" which inverts the data received from a bus output 96. The inverted driver input 74 works in combination with the exclusive OR gate 72 to provide this data inversion. The data inversion can be used to improve the performance of testing the data stored in the array 36" under certain design applications.

It should be appreciated that in each of the embodiments of the present invention, the need to shift an entire data word through both the data register and address register is eliminated. A particular data word need only be shifted into the data register 40. The address incrementing block 34 provides a unique address location to the array 36 where a particular data word will be stored. The various embodiments of the present invention illustrate different techniques of implementing the address incrementing block 34. Whichever technique is implemented, superior performance is achieved over the prior art. The implementation of the address incrementing block 34 significantly improves the speed of programming and testing a PLD.

In a parallel programming implementation of the present invention as shown in FIGS. 5 and 6, a significant improvement in programming performance is realized. For example, consider a prior art device 10 that uses eight addresses and eight data input pins and takes two cycles to load a data word and address. The present invention would require only eight data pins and no address pins and take only one clock cycle to load the data word and address. As a result, the programming of the device using the present invention would see a 50% reduction in the pin requirements as well as a 50% improvement in performance during pattern loading and verifying.

In a serial programming implementation of the present invention, such as shown in FIG. 4, an even greater improvement over the prior art techniques is realized. Consider a prior art device that would require 8+14 bits to be shifted for each data word and address. The present invention would require only eight bits to implement the same result. As a result, a significant performance improvement is realized. The performance improvement is illustrated by the following equation EQ1:

$$\frac{(14+8)-8}{(14+8)} = 0.64$$

As a result, the serial program would result in a performance improvement of 64% while maintaining identical pin requirements. Since the programming of both serial and parallel devices requires shifting only the data register values, the programming pattern (JDEC) files can be correspondingly reduced in size.

It is to be understood that modifications to the invention might occur to one with skill in the field of the invention within the scope of the appended claims.

What is claimed is:

1. A circuit comprising:

a first register having (i) a first input coupled to a first clock, (ii) a first bus output, (iii) a divider circuit configured to divide said clock by a predetermined value to present an output and (iv) a counter having an input coupled to said output of said divider means and an output, said counter for progressing to a new value in response to said input, said first register for decoding a unique address location presented at said first bus output;

a second register having a first input coupled to said first clock, a second input coupled to a data input, a second bus output and a first output providing a data input/output, said second register for presenting data at said second bus output; and an array of programming elements having an address input coupled to said first bus output, a data input/output coupled to said second bus output, said array of programming elements for reading/writing data from said second register to a portion of said array of programming elements defined by said unique address location received by said address input.

2. The circuit according to claim 1 wherein said first register comprises a registered counter for providing a different said unique address location at a periodic interval of said clock.

3. The circuit according to claim 1 wherein said first register further comprises a control input for providing initialization information used during power up of said circuit.

4. The circuit according to claim 2 wherein said different unique address location is provided sequentially.

5. The circuit according to claim 1 wherein said second register comprises a shift register.

6. The circuit according to claim 1 wherein said second register comprises a parallel load register.

7. The circuit according to claim 1 wherein said data input is a serial data input.

8. The circuit according to claim 1 wherein said data input is a parallel data input.

9. A circuit for programming a logic device comprising:

first register means for decoding a unique address location within an address space of a logic device, said first register means having (i) a first bus output, (ii) a first input coupled to a clock, (iii) a divider means for dividing said clock by a predetermined value to present an output and (iv) counter means having an input coupled to said output of said divider means and an output, said counter means for progressing to a new value in response to said input, said first register means presenting said unique address location at said first bus output;

second register means having a first input coupled to said clock, a second input coupled to a data input, a first output providing a data input/output and a second output, said second register for presenting data at said second output and for reading and writing data at said data input/output, said second register having a fixed width; and a memory array having an address input coupled to said first bus output, a data input/output coupled to said second output, said memory array for reading and writing data from said second register to a portion of said memory array defined by said unique address location received by said address input.

10. The circuit according to claim 9 wherein said first register means further comprises:

address register means having an output, a first input coupled to said output of said counter means and a second input for receiving control information for said circuit.

11. The circuit according to claim 9 wherein said predetermined value is equal to said fixed width of said second register.

12. The circuit according to claim 10 wherein said predetermined value is equal to a width of said second bus output divided by a width of said first output.

13. The circuit according to claim 10 wherein said predetermined value is programmable.

14. The circuit according to claim 9 wherein said second register comprises a shift register.

15. The circuit according to claim 9 wherein said second register comprises a parallel load registerer.

16. The circuit according to claim 10 wherein said counters progress to said new value in a sequential fashion.

17. A circuit for programming a logic device comprising:

first register means for decoding a unique address location within an address space of a logic device, said first register means having a first bus output and a first input coupled to a clock, said first register means presenting said unique address location at said first bus output, wherein said first register means includes:

divider means for dividing said clock by a predetermined value, said divider means having an input coupled to said clock and an output;

counter means having an input coupled to said output of said divider means and an output, said counter means for progressing to a new value in response to said input; and second register means having a first input coupled to said clock, a second input coupled to a parallel data input, a first output providing a parallel data input/output and a second output, said second register for presenting data at said second output and for reading and writing said data at said data input/output, said second register having a fixed width; and a memory array having an address input coupled to said first bus output, a data input/output coupled to said second output, said memory array for reading and writing data from said second register to a portion of said memory array defined by said unique address location received by said address input.

18. The circuit according to claim 17 wherein said first register comprises a registered counter for providing a different said unique address location at a periodic interval of said clock.

19. The circuit according to claim 17 wherein said first register further comprises a control input for providing control information for said circuit.

20. The circuit according to claim 18 wherein said different unique address location is provided sequentially.

21. The circuit according to claim 17 wherein said first register means further comprises:
   address register means having an output, a first input coupled to said output of said counter means and a second input for receiving control information for said circuit.

22. The circuit according to claim 20, wherein said predetermined value is equal to said fixed width of said second register.

23. The circuit according to claim 20, wherein said predetermined value is equal to a width of said second output divided by a width of said first output.

24. The circuit according to claim 20, wherein said predetermined value is programmable.

25. A circuit for programming a logic device comprising:
   first register means for decoding a unique address location comprising a plurality of address pointers defining an address space within a logic device, said first register means having a plurality of outputs and a first input coupled to a clock, said first register means presenting said unique address location at said plurality of bus outputs, wherein said first register means includes:
      a plurality of dividers each dividing said clock by a predetermined value equal to said fixed width of said second register, each of said dividers having an input coupled to said clock and an output; and
      a plurality of counters each having an input coupled to said output of said divider means and an output, each of said counters for progressing to a new value in response to said input;
   second register means having a first input coupled to said clock, a second input coupled to a data input, a first output providing a data input/output and a data bus output, said second register for presenting data at said data bus output and for reading and writing data at said data input/output, said second register having a fixed width; and
   a memory array having an address input coupled to said plurality of bus input/outputs and data input coupled to said data bus output, said memory array for reading and writing data from said second register to a portion of said memory array defined by said unique address location received by said address input.

26. The circuit according to claim 26 wherein said first register means further comprises:
   a plurality of address registers each having an output, a first input coupled to said output of said counter means and a second input for receiving control information for said circuit.

27. The circuit according to claim 25 wherein a combination one of said plurality of dividers, one of said counters and one of said address registers corresponds to an element of an address location.

28. The circuit according to claim 27 wherein said number of elements is two where a first element represents a row and a second element represents a column of a row x column memory organization.

29. The circuit according to claim 25 wherein said counters progress to said new value in a sequential fashion.

30. The circuit according to claim 25 further comprising means for inverting said data read from said second register.

31. The circuit according to claim 30 wherein said means comprises an exclusive OR gate having a first input coupled to said data bus output, a second input coupled to an inverting signal and an output coupled to said data input, said means inverts said data at said data bus output when said inverting signal is present.

32. A Programmable Logic Device (PLD) comprising:
   a bus input; and
   the circuit of claim 1.

* * * * *